United States Patent
Lechner et al.

(10) Patent No.: US 10,495,494 B2
(45) Date of Patent: Dec. 3, 2019

(54) METHOD AND CIRCUIT FOR DETECTING A SHORT CIRCUIT OF THE SINE OR COSINE RECEIVER COIL OF A RESOLVER

(71) Applicant: Robert Bosch GmbH, Stuttgart (DE)

(72) Inventors: Benjamin Lechner, Neuhausen (DE);
Daniel Zirkel, Wiernsheim-Serres (DE);
Daniel Raichle, Vaihingen (DE);
Michael Ungermann, Darmstadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/736,042

(22) PCT Filed: Jun. 7, 2016

(86) PCT No.: PCT/EP2016/062846
§ 371 (c)(1),
(2) Date: Dec. 13, 2017

(87) PCT Pub. No.: WO2016/202630
PCT Pub. Date: Dec. 22, 2016

(65) Prior Publication Data
US 2018/0164132 A1 Jun. 14, 2018

(30) Foreign Application Priority Data
Jun. 18, 2015 (DE) .......... 10 2015 211 216

(51) Int. Cl.
*G01D 18/00* (2006.01)
*G01D 5/22* (2006.01)
(Continued)

(52) U.S. Cl.
CPC .......... *G01D 18/00* (2013.01); *G01D 5/2291* (2013.01); *G01R 31/025* (2013.01); *G01R 31/2829* (2013.01)

(58) Field of Classification Search
CPC .. G01D 18/00; G01D 5/2291; G01R 31/2829; G01R 31/025; G01B 7/30
(Continued)

(56) References Cited

U.S. PATENT DOCUMENTS 8,754,638 B2 * 6/2014 Kichise ............... G01D 5/2046
324/207.16
2001/0054911 A1 12/2001 Kobayashi et al.
(Continued)

FOREIGN PATENT DOCUMENTS

DE 102008022979 2/2009
DE 102011078583 1/2013
EP 2562516 2/2013

OTHER PUBLICATIONS

International Search Report for Application No. PCT/EO2016/062846 dated Sep. 22, 2016 (English Translation, 3 pages).

*Primary Examiner* — Farhana A Hoque
(74) *Attorney, Agent, or Firm* — Michael Best & Friedrich LLP

(57) ABSTRACT

A method for detecting a short circuit to ground or to the operating voltage of a signal line (11, 12) of a resolver (16) has the following steps: —measuring the potential of the signal lines (13a, 13b; 14a, 14b) of the receiver coil (18) with respect to ground at two sampling times (R and F) provided symmetrically at the middle of the excitation period; —calculating an offset value for a signal line pair (13a, 13b; 14a, 14b) by calculating the average value of the four measured values ($U_{HR}$, $U_{LR}$, $U_{HF}$ and $U_{LF}$) for the associated receiver coil (17, 18); and —identifying a short circuit and the potential to which the short-circuited line is connected in that the offset value is compared to threshold values.

9 Claims, 2 Drawing Sheets

(51) Int. Cl.
*G01R 31/02* (2006.01)
*G01R 31/28* (2006.01)

(58) Field of Classification Search
USPC .......................................... 324/207.16, 510
See application file for complete search history.

(56) References Cited

U.S. PATENT DOCUMENTS

2012/0185213 A1   7/2012  Wada et al.
2013/0293251 A1*  11/2013 Martin ................ G06F 13/4247
                                                324/750.3
2014/0142782 A1   5/2014  Fu et al.

* cited by examiner

METHOD AND CIRCUIT FOR DETECTING A SHORT CIRCUIT OF THE SINE OR COSINE RECEIVER COIL OF A RESOLVER

BACKGROUND OF THE INVENTION

The present invention relates to a method for detecting a short circuit of a resolver signal line of the sine or cosine receiver coil to ground or to the operating voltage, and a circuit for implementing this method.

Resolvers are used for ascertaining the angular position of a rotating object, for example, the drive shaft of a motor. There are various types of resolvers in the prior art. Generally, a changing magnetic field is generated by means of at least one coil, and this field is detected by means of at least one additional coil, wherein the strength of the coupling between the coils varies as a function of the position or angular position to be measured. In the case of the variable reluctance resolver (VR resolver), for example, only one excitation coil is used, and there are two measuring coils which generate position-dependent signals. German patent application DE 10 2011 078 583 A1 discloses, for example, an evaluation of resolver sensor signals in a vehicle. For this purpose, a resolver picks up a rotational movement of a rotor, and a processor element processes the sine-shaped and cosine-shaped output signals of the resolver.

The present invention is directed to such a resolver, wherein the excitation signal is sinusoidal and typically has a frequency of 10 kHz. The two measurement coils are generally positioned orthogonally with respect to one other and are referred to as the sine coil and the cosine coil. The angle of the measured object may be unambiguously determined via the two measurement signals.

The excitation signal for the excitation coil may, for example, be provided via two push-pull output stages, one each for the two terminals of the excitation coil. The output signals of the two output stages are then phase-shifted by 180° with respect to one other, and the excitation signal which is effective for the excitation coil is the differential voltage between the outputs of the two output stages.

However, there is also the possibility of driving the excitation coil via only one output stage. The second terminal of the excitation coil is then set to a fixed potential, for example, ground potential, either directly or via a capacitor.

An AC voltage signal having the same frequency as the excitation signal results at the receiver coils, the amplitude of said signal, however, being modulated according to the rotor position, wherein the signal at the cosine coil is phase-shifted by 90° with respect to the signal at the sine coil.

Resolvers are often used for controlling permanently excited synchronous machines (PSMs) and electrically excited synchronous machines (ESMs), which, for example, are used as the drive for hybrid and electric vehicles. For such control, knowledge of the instantaneous rotor angle position is necessary. For controlling asynchronous machines (ASMs), knowledge of the instantaneous frequency of the drive is required.

Because of their robustness, resolvers are preferably used in motor vehicles for these purposes, even if there are alternative sensors, for example, digital angle sensors or sensors based on the eddy-current effect.

For sensors in the automobile sector, diagnostic options for ascertaining possible faults are desirable. In the case of resolvers which are the subject matter of the present application, a possible fault to be diagnosed is a short circuit of a resolver signal line to ground or to the operating voltage $U_B$. Hereinafter, a short circuit will be understood to mean merely an undesirable electrical connection of one of the signal lines to ground or to the operating voltage $U_B$, wherein the diagnosis is also intended to determine which of these potentials forms the undesirable connection.

In the prior art, such a fault is diagnosed in that it triggers clipping (overdriving) of the corresponding A/D converter. However, such a diagnosis is not sufficient, because A/D converter clipping may also have other causes.

SUMMARY OF THE INVENTION

The method for detecting a short circuit to ground or to the operating voltage of the signal line of a resolver comprises the measurement of the potential of the signal lines of the receiver coil with respect to ground at two sampling instants (R and F) which are situated symmetrically with respect to the midpoint of the excitation period. Using this data, the calculation of an offset value $U_{DC}$ is carried out for the respective signal line pair by forming the average of the four measured values ($U_{HR}$, $U_{LR}$, $U_{HF}$, and $U_{LF}$) of the respective receiver coil:

$$U_{DC}=\frac{1}{4}*(U_{HR}+U_{LR}+U_{HF}+U_{LF}),$$

where H (high) and L (low) denote the two lines of the signal line pair.

The identification of a short circuit and the potential (to ground or $U_B$) toward which the short-circuited line is pulled is then made possible by comparing the offset value to limit values.

Another aspect of the present invention is a circuit which implements this method. The circuit is based on the circuit to be analyzed, which comprises a control device including a processor, power stages, and first terminals for providing the signals for the excitation lines, as well as two A/D converters which are connected to second terminals of the control device for the signal lines, the outputs of said A/D converters being continuously read and evaluated by the software of the processor. Furthermore, the circuit includes excitation lines to the excitation coil of the resolver, as well as the signal lines for the sine and cosine signals which are to be diagnosed and which return to the control device. The circuit requires pull-up resistors which are connected via their one end to one of the terminals for the lines sine coil and of the cosine coil and via their other end to a first DC voltage potential $U_H$, and pull-down resistors which are connected on their one end to the respective other one of the terminals for the lines sine coil and of the cosine coil and which via their other end to a second DC voltage potential $U_L$. For measuring the potential of the signal lines of the receiver coil with respect to ground at the sampling instants, either the converters may be used for the signal data, in that four electronic switches are inserted into the four connections of the terminals for the signal lines to the inputs of these A/D converters, wherein the switches are configured in such a way that they respectively disconnect one input of the A/D converter from the signal line and temporarily connect this input to ground at the sampling instants. Alternatively, four additional A/D converters may be provided, in which one input is set to ground, and the other input are connected to one of the terminals for the signal lines of the sine coil and the cosine coil and which are queried only at the sampling instants. In addition, the circuit comprises a display and/or storage device for displaying and/or storage of the information identified by the processor, into which the positive detection of a short circuit of one of the signal lines of the resolver, and the designation of the short-circuited line and the potential toward which this line is pulled, is incorporated.

The advantage of the present invention is that the fault to be diagnosed may be precisely differentiated from other faults (pinpoint diagnosis).

The diagnosis is very quick, with a reliable fault diagnosis being available after just a few periods of the excitation signal having a typical duration of 0.1 ms, and it is possible to take appropriate measures if needed. Thus, in particular requirements for sensors in the automobile sector are met with respect to functional safety and with respect to OBD (on-board diagnosis) functionality.

It is furthermore advantageous that the method according to the present invention may be implemented with minimal supplementation of the usual hardware of a resolver controller.

DETAILED DESCRIPTION

Figure 1:
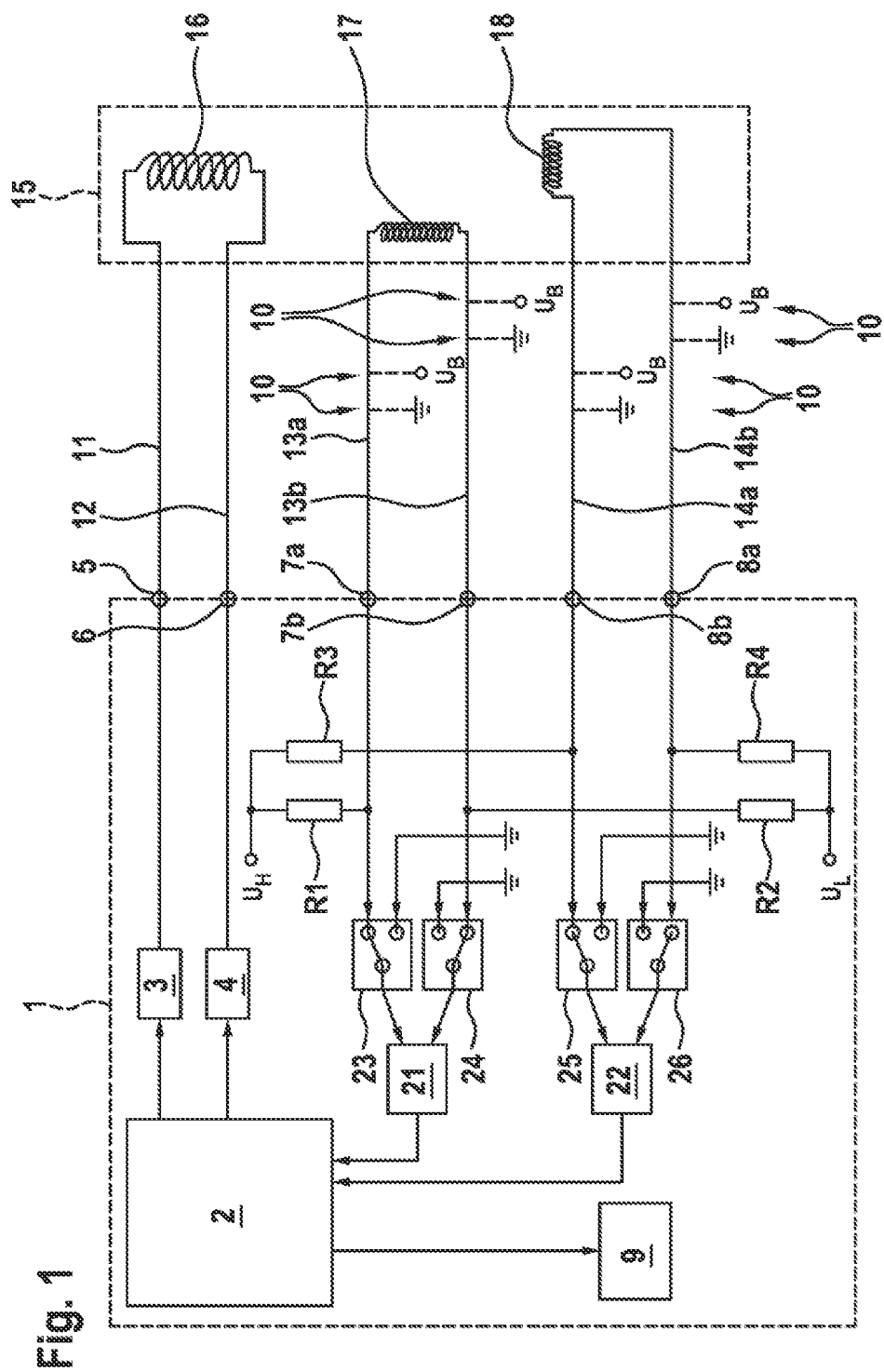
FIG. 1 shows a circuit according to one exemplary embodiment of the present invention.

FIG. 1 focuses on the control device 1 for the resolver 15, it being possible to integrate said control device into the control unit for a vehicle (not depicted here). Said control device includes (or shares the use of) a processor 2 which monitors the correct operation of all resolver functions which are to be controlled, and also displays malfunctions if needed.

The control device 1 in particular controls the power stages 3 and 4 for providing the sinusoidal excitation signal for the excitation coil 16 of the resolver 15 to the first terminals 5 and 6. At the second terminals 7a, 7b and 8a, 8b, the signals of the sine coil 17 and the cosine coil 18, which represent the instantaneous angular position of the measured object (for example, the shaft of the motor), enter the control device 1 and may be further processed via software as a digital signal after conversion in the A/D converters 21 and 22.

The resolver signal lines 13a, 13b, 14a, and 14b are the connection from the second terminals 7a, 7b and 8a, 8b of the control device 1 to the resolver 15, i.e., to its sine coil 17 and cosine coil 18. It is essential to monitor these lines for a short circuit 10, i.e., an undesirable connection to ground or to the operating voltage $U_B$, as is indicated in FIG. 1 by the potential connections 10 represented by dashed lines.

For performing the short-circuit diagnosis, the voltage profile of the individual signal lines to ground is evaluated, wherein the evaluation for the sine and cosine coils 17 and 18 is carried out in the same manner. For doing this, the signal lines must already have a defined potential without the occurrence of a short circuit. Pull-up resistors $R_1$ and $R_3$ are therefore used, which are connected via their one end to one of the terminals 7a, 8a for the lines 13a, 14a sine coil 17 and of the cosine coil 18, and via their other end to a first DC voltage potential $U_H$; and pull-down resistors $R_2$ and $R_4$, which are connected via their one end to the other one of the terminals 7b, 8b for the lines 13b, 14b of the sine coil 17 and the cosine coil 18, and which via their other end to a second DC voltage potential $U_L$. Corresponding to the resistor ratio, a voltage division results between $U_H$ and $U_L$ if the ohmic resistance of the receiver coils is small relative to that of the resistors $R_1$, $R_2$, $R_3$, and $R_4$.

In order to measure the voltages to ground at the signal line connections to the A/D converters 21 and 22 for the resolver signal for the purpose of fault diagnosis, an electronic switch 23, 24, 25, and 26 may be inserted into each of the connections of the terminals 7a, 7b, 8a, and 8b for the signal lines 13a, 13b, 14a, and 14b to inputs H and L of the A/D converters 21, 22. These four switches are configured in such a way that they respectively disconnect an input of the A/D converter (21, 22) from the terminal 7a, 7b, 8a, and 8b for the signal lines 13a, 13b, 14a, and 14b, and temporarily connect this input to ground. Alternatively, instead of the switches, four additional A/D converters may be used (not depicted in FIG. 1), which is set to ground via one of their two inputs, while the other input is connected to one of the terminals 7a, 7b, 8a, and 8b for the signal lines 13a, 13b, 14a, and 14b.

Figure 2:
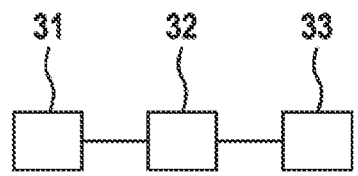
FIG. 2 schematically describes the steps for carrying out the method, according to one exemplary embodiment of the present invention.

The measurement (31 in FIG. 2) of the potential, i.e., the voltage to ground, at the terminals 7a, 7b, 8a, and 8b of signal lines 13a, 13b, 14a, and 14b of the receiver coils 17 and 18, is carried out in that either the respective switch 26, 27, 28, or 29 is switched over for this sampling, or, in the case of the use of the alternative circuit, the respective corresponding additional A/D converter is queried. As FIG. 3 illustrates, the measurement takes place at two sampling instants R (or rise) and F (or fall) which are situated symmetrically with respect to the midpoint of the excitation period, wherein the one of the lines is designated by H (or high) and the other by L (or low).

The calculation (32 in FIG. 2) of an offset value $U_{DC}$ is carried out via the resulting four measured values for each line pair 13a and 13b (or 14a and 14b), i.e., via two measured values each on the two lines H and L to the respective terminals 7a and 7b (or 8a and 8b) of the receiver coil 17 (or 18) to be measured, at the two instants R and F. This takes place by forming the average value of these four measured values $U_{HR}$, $U_{LR}$, $U_{HF}$, and $U_{LF}$:

$$U_{DC} = \frac{1}{4} * (U_{HR} + U_{LR} + U_{HF} + U_{LF})$$

Figure 3:
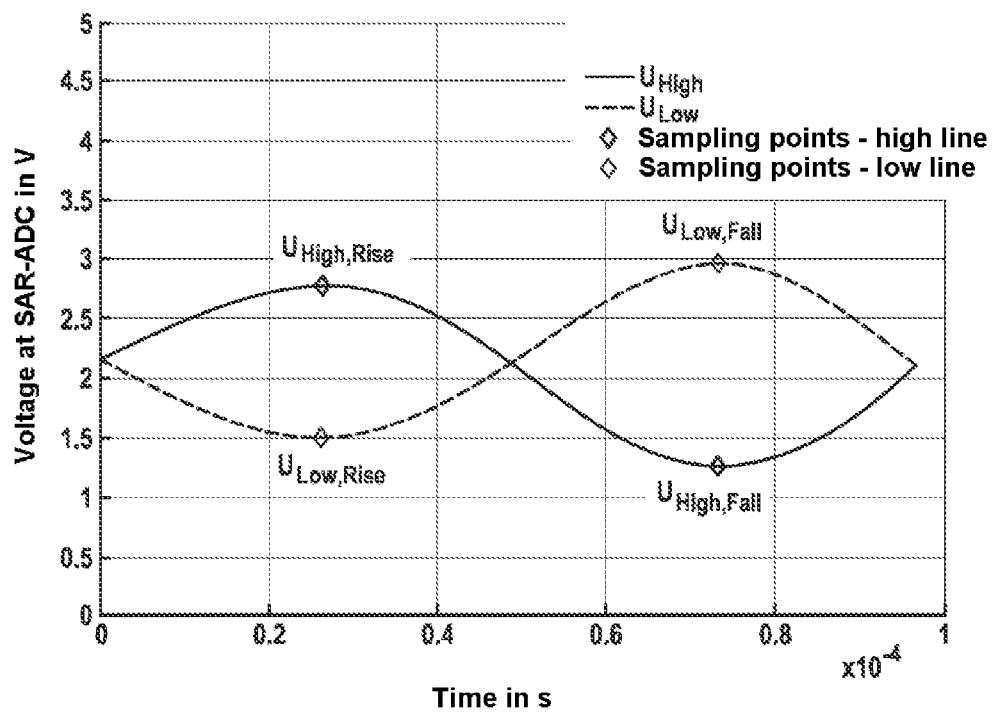
FIG. 3 describes the temporal development of the potential of the signal lines.

FIG. 3 describes the meaning of this offset value. It is apparent that via the time-symmetrical sampling, the potential contributions which are induced by the sinusoidal excitation signal mutually cancel out one another, and the voltage division which is determined by the pull-up and pull-down resistors remains as an average value. However, in the event of a fault, the offset value is the potential caused by the short circuit, i.e., toward ground or $U_B$, and the resistors $R_1$, $R_2$, $R_3$, and $R_4$ have little or no further influence.

Thus, the identification of a short circuit 10 and the potential (toward ground or $U_B$), toward which the short-circuit line is pulled (cf. FIG. 1), may be carried out in that the offset value $U_{DC}$ is compared (33 in FIG. 2) to limit values $C_G$ for a short to ground, and $C_B$ for a connection to the operating voltage $U_B$. In fact, if $$U_{DC} < C_G$$

a short to ground may be diagnosed, whereas with $$U_{DC} > C_B$$

a connection to the operating voltage $U_B$ may be diagnosed.

On the basis of the determination of which of these cases exists, the processor 2 is able to diagnose whether a short circuit 10 of a signal line exists, and the required measures may be carried out.

A display and/or storage device 9 is used for displaying and/or storing the information ascertained by the processor 2. The positive detection of a short circuit 10, and the designation of the short-circuited line pair and the potential (ground or $U_B$) toward which this line is pulled, are included in this display. In this case, the short-circuited line pair may, for example, be designated by its color or reference number.

The invention claimed is:

1. A method for detecting a short circuit (10) to ground or to the operating voltage (UB) of a signal line (11, 12) of a resolver (16), having the following steps:
   measuring (31) the potential of the signal lines (13a, 13b; 14a, 14b) of the receiver coil with respect to ground at two sampling instants (R, F) which are situated symmetrically with respect to the midpoint of the excitation period; calculating (32) an offset value (UDC) for the respective signal line pair (13a, 13b; 14a, 14b) by forming the average of the four measured values (UHR, ULR, UHF, ULF) of the respective receiver coil (17, 18); and
   identifying (33) a short circuit and the potential toward which the short-circuited line is able to be pulled, by comparing the offset value to limit values.

2. The method as claimed in claim 1, wherein pull-up resistors (R1; R3) and pull-down resistors (R2; R4) which are connected to the signal lines (13a, 13b; 14a, 14b) are supplied with a voltage potential via their other end.

3. The method as claimed in claim 2, wherein the voltage potentials of the pull-up resistors (R1; R3) and the pull-down resistors (R2; R4) differ from one another by a constant amount which is smaller than the measurement range of the A/D converters for the measured values of the receiver coil.

4. A circuit for detecting a short circuit of a signal line (11, 12) of a resolver (16) to ground or to the operating voltage (UB), including:
   a control device (1) including a processor (2), power stages (3, 4) and first terminals (6, 7) for providing signals for excitation lines (11, 12) to an excitation coil (16) of the resolver (15), and second terminals (7a, 7b, 8a, 8b) for connecting signal lines (13a, 13b, 14a, 14b) for the signals of a sine coil and a cosine coil (17, 18);
   two A/D converters (21, 22) which are connected to the second terminals (7a, 7b and 8a, 8b) of the control device (1), the outputs of which being readable and evaluable by the software of the processor (2);
   the excitation lines (11, 12) which couple the first terminals (5, 6) of the excitation coil (16) to the resolver (15);
   the signal lines (13a, 13b, 14a, 14b) which are to be diagnosed for the sine and cosine signals provided by the resolver (15), and which couple the resolver to the two terminals (7a, 7b, 8a, 8b) of the control device (1);
   pull-up resistors (R1, R3) which are connected via their one end to one of the terminals (7a, 8a) for the conductors (13a, 14a) sine coil (17) and of the cosine coil (18), and via their other end to a first DC voltage potential (UH);
   pull-down resistors (R2 and R4) which are connected via their one end to the other one of the terminals (7b, 8b) for the lines (13b, 14b) sine coil (17) and of the cosine coil (18), and which are connected via their other end to a second DC voltage potential (UL);
   four electronic switches (26, 27, 28, 29) which are inserted into the connection of the terminals (7a, 7b; 8a, 8b) for the signal lines (13a, 13b; 14a, 14b) to inputs (H, L) of the A/D converters (21, 22), wherein the switches (26, 27, 28, 29) are configured such that they respectively disconnect one input of the A/D converter (21, 22) from the signal line (13a, 13b; 14a, 14b) and temporarily connect this input to ground; and
   a display and/or storage device (9) for displaying and/or storing the information identified by the processor (2), into which the positive detection of a short circuit (10) of a signal line (11, 12) of a resolver (16) to ground or to the operating voltage (UB) by the processor (2) is incorporated.

5. The circuit as claimed in claim 4, wherein the pull-up resistors (R1 and R3) and pull-down resistors (R2 and R4) are integrated into the control device (1).

6. The circuit as claimed in claim 4 or 5, wherein the resistance values of the pull-up resistors (R1 and R3) and pull-down resistors (R2 and R4) are large relative to the ohmic resistance of the sine coil (17) and the cosine coil (18).

7. A circuit for detecting a short circuit of a signal line (11, 12) of a resolver (16) to ground or to the operating voltage (UB), including:
   a control device (1) including a processor (2), power stages (3, 4) and first terminals (6, 7) for providing signals for excitation lines (11, 12) to an excitation coil (16) of the resolver (15), and second terminals (7a, 7b, 8a, 8b) for connecting signal lines (13a, 13b, 14a, 14b) for the signals of a sine coil and a cosine coil (17, 18);
   two A/D converters (21, 22) which are connected to the second terminals (7a, 7b and 8a, 8b) of the control device (1), the outputs of which being readable and evaluable by the software of the processor (2);
   the excitation lines (11, 12) which couple the first terminals (5, 6) of the excitation coil (16) to the resolver (15);
   the signal lines (13a, 13b, 14a, 14b) which are to be diagnosed for the sine and cosine signals provided by the resolver (15), and which couple the resolver to the two terminals (7a, 7b, 8a, 8b) of the control device (1);
   pull-up resistors (R1, R3) which are connected via their one end to one of the terminals (7a, 8a) for the conductors (13a, 14a) sine coil (17) and of the cosine coil (18), and via their other end to a first DC voltage potential (UH);
   pull-down resistors (R2 and R4) which are connected via their one end to the other one of the terminals (7b, 8b) for the lines (13b, 14b) sine coil (17) and of the cosine coil (18), and which are connected via their other end to a second DC voltage potential (UL);
   four additional A/D converters in which one input is set to ground, and the other inputs are connected to one of the terminals (7a, 7b, 8a, 8b) for the signal lines (13a, 13b, 14a, 14b) of the sine coil (17) and the cosine coil (18); and
   a display and/or storage device (9) for displaying and/or storing the information identified by the processor (2), into which the positive detection of a short circuit (10) of a signal line (11, 12) of a resolver (16) to ground or to the operating voltage (UB) by the processor (2) is incorporated.

8. The circuit as claimed in claim 7, wherein the pull-up resistors (R1 and R3) and pull-down resistors (R2 and R4) are integrated into the control device (1).

9. The circuit as claimed in claim 7, wherein the resistance values of the pull-up resistors (R1 and R3) and pull-down resistors (R2 and R4) are large relative to the ohmic resistance of the sine coil (17) and the cosine coil (18).

* * * * *